(12) United States Patent
Miao et al.

(10) Patent No.: US 10,424,639 B1
(45) Date of Patent: Sep. 24, 2019

(54) NANOSHEET TRANSISTOR WITH HIGH-MOBILITY CHANNEL

(71) Applicant: International Business Machines Corporation, Armonk, NY (US)

(72) Inventors: Xin Miao, Guilderland, NY (US); Wenyu Xu, Albany, NY (US); Kangguo Cheng, Schenectady, NY (US); Chen Zhang, Albany, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 15/957,317

(22) Filed: Apr. 19, 2018

(51) Int. Cl.
| | | |
|---|---|---|
| H01L 27/148 | (2006.01) | |
| H01L 29/06 | (2006.01) | |
| H01L 21/02 | (2006.01) | |
| H01L 21/8258 | (2006.01) | |
| H01L 21/306 | (2006.01) | |
| H01L 29/78 | (2006.01) | |
| H01L 21/84 | (2006.01) | |
| H01L 27/092 | (2006.01) | |
| H01L 27/12 | (2006.01) | |
| H01L 29/423 | (2006.01) | |
| H01L 21/8238 | (2006.01) | |

(52) U.S. Cl.
CPC ...... *H01L 29/0673* (2013.01); *H01L 21/0228* (2013.01); *H01L 21/02532* (2013.01); *H01L 21/02546* (2013.01); *H01L 21/30604* (2013.01); *H01L 21/8258* (2013.01); *H01L 21/823821* (2013.01); *H01L 21/845* (2013.01); *H01L 27/0922* (2013.01); *H01L 27/0924* (2013.01); *H01L 27/1211* (2013.01); *H01L 29/42392* (2013.01); *H01L 29/7853* (2013.01)

(58) Field of Classification Search
None
See application file for complete search history.

(56) References Cited

U.S. PATENT DOCUMENTS

| | | | |
|---|---|---|---|
| 9,123,567 B2 | 9/2015 | Radosavljevic et al. | |
| 9,362,355 B1 | 6/2016 | Cheng et al. | |
| 9,406,506 B2 | 8/2016 | Fogel et al. | |
| 9,425,291 B1 | 8/2016 | Balakrishnan et al. | |
| 9,437,502 B1 | 9/2016 | Cheng et al. | |
| 9,659,829 B1 | 5/2017 | Balakrishnan et al. | |
| 2013/0270512 A1 | 10/2013 | Radosavljevic et al. | |
| 2014/0099774 A1* | 4/2014 | Vincent ............ H01L 29/66795 | 438/431 |
| 2015/0126008 A1 | 5/2015 | Paul et al. | |
| 2015/0364546 A1 | 12/2015 | Rodder et al. | |
| 2017/0092736 A1 | 3/2017 | Balakrishnan et al. | |
| 2017/0141207 A1* | 5/2017 | Cheng ............... H01L 29/66742 | |

* cited by examiner

*Primary Examiner* — Calvin Y Choi
(74) *Attorney, Agent, or Firm* — Cantor Colburn LLP; Vazken Alexanian

(57) ABSTRACT

A method of fabricating a semiconductor device includes forming a gate on a nanosheet stack including a first nanosheet and a second nanosheet. The first nanosheet and the second nanosheet each include a dielectric material. The method includes removing a portion of the nanosheet stack in a source/drain region adjacent to the gate to form a trench and depositing a first semiconductor material in the trench. The method further includes removing the second nanosheet from the nanosheet stack to form a channel region gap in the nanosheet stack and depositing a second semiconductor material in the channel region gap to form a channel.

20 Claims, 15 Drawing Sheets

NANOSHEET TRANSISTOR WITH HIGH-MOBILITY CHANNEL

BACKGROUND

The present invention generally relates to fabrication methods and resulting structures for semiconductor devices. More specifically, the present invention relates to nanosheet transistors with high mobility channels.

In an integrated circuit, each metal oxide semiconductor field effect transistor (MOSFET) has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer. Complementary metal oxide semiconductor (CMOS) is a technology that uses complementary and symmetrical pairs of p-type and n-type MOSFETs to implement logic functions. The channel region connects the source and the drain, and electrical current flows through the channel region from the source to the drain. The electrical current flow is induced in the channel region by a voltage applied at the gate electrode.

Non-planar MOSFET architectures, such as nanosheet (or nanowire) transistors, can provide increased device density and increased performance over planar transistors. Nanosheet transistors, in contrast to conventional planar FETs, include a gate stack that wraps around the full perimeter of multiple nanosheet channel regions for improved control of channel current flow. Nanosheet transistors enable fuller depletion in the nanosheet channel regions and reduce short-channel effects.

SUMMARY

Embodiments of the present invention are directed to a method for fabricating a semiconductor device. A non-limiting example of the method includes forming a gate on a nanosheet stack including a first nanosheet and a second nanosheet. The first nanosheet and the second nanosheet each include a dielectric material. The method includes removing a portion of the nanosheet stack in a source/drain region adjacent to the gate to form a trench and depositing a first semiconductor material in the trench. The method further includes removing the second nanosheet from the nanosheet stack to form a channel region gap in the nanosheet stack and depositing a second semiconductor material in the channel region gap to form a channel.

Another non-limiting example of the method includes forming a gate on a nanosheet stack including a first nanosheet and a second nanosheet. The first nanosheet and the second nanosheet each include a dielectric material, and the nanosheet stack is arranged on a nitride layer. The method includes removing a portion of the nanosheet stack in a source/drain region adjacent to the gate to form a trench and depositing a first semiconductor material in the trench. The method further includes removing the second nanosheet from the nanosheet stack to form a channel region gap in the nanosheet stack. The method includes depositing a second semiconductor material in the channel region gap to form a channel. The second semiconductor material includes silicon germanium, germanium or a III-V material.

According to one or more embodiments, a semiconductor device includes a nanosheet channel including silicon germanium, germanium or a III-V material arranged on a substrate. The semiconductor device includes a gate arranged on the nanosheet channel and a source/drain adjacent to the channel.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIGS. 1-14 depict a process flow for fabricating a semiconductor device according to embodiments of the invention, in which:

FIG. 1 depicts a cross-sectional side view of a semiconductor structure with a nanosheet stack arranged on a substrate;

FIG. 3 depicts a cross-sectional side view of the semiconductor structure shown in FIG. 2B taken along line A-A' and after forming gate spacers on the dummy gates;

FIG. 4 depicts a cross-sectional side view of the semiconductor structure after patterning a mask and etching to form trenches in source/drain regions;

FIG. 5 depicts a cross-sectional side view of the semiconductor structure after performing an epitaxial growth process to form epitaxial growth in the trenches;

FIG. 6 depicts a cross-sectional side view of the semiconductor structure after patterning a mask and selective etching to form trenches;

FIG. 7 depicts a cross-sectional side view of the semiconductor structure after removing the mask and performing an epitaxial growth process to form channel materials;

FIG. 8 depicts a cross-sectional side view of the semiconductor structure after removing material over the source/drain regions;

FIG. 9 depicts a cross-sectional side view of the semiconductor structure after depositing a dielectric material;

FIG. 10 depicts a cross-sectional side view of the semiconductor structure after forming indents for inner spacer formation;

FIG. 11 depicts a cross-sectional side view of the semiconductor structure after depositing inner spacer material in the indents;

FIG. 12 depicts a cross-sectional side view of the semiconductor structure after removing the inner spacer material from sidewalls of the dummy gates;

FIG. 13 depicts a cross-sectional side view of the semiconductor structure after forming source/drains; and FIG. 14 depicts a cross-sectional side view of the semiconductor structure after replacing dummy gates with metal gate stacks.

Figure 1:
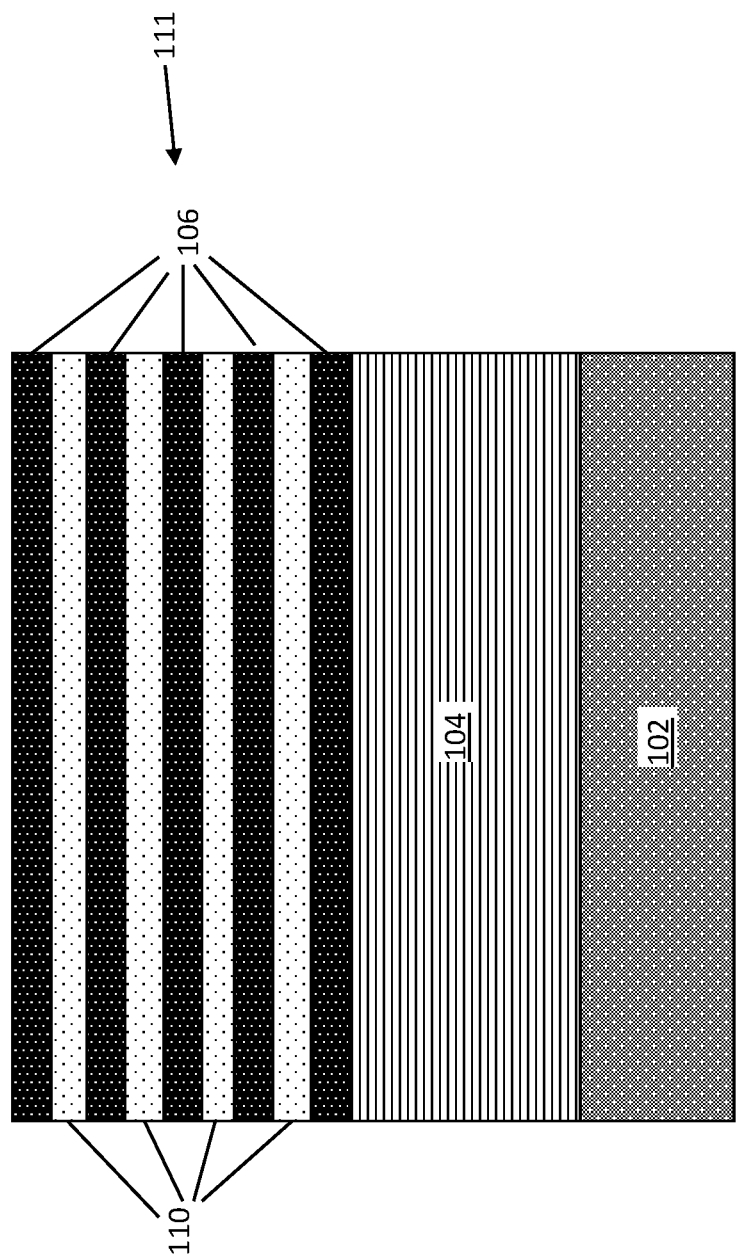

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, the wafer footprint of a FET needs to be downscaled and the FET performance needs to be improved for future technologies. If the channel material has a relatively high conductivity, the FET's performance would be improved. A known method of increasing channel conductivity and decreasing FET size is to form the channel as a nanostructure. For example, the gate-all-around (GAA) nanosheet FET is an architecture for providing a relatively small FET footprint by forming the channel region as a series of nanosheets. In a known GAA configuration, a nanosheet-based FET includes a source region, a drain region and stacked nanosheet channels between the source and drain regions. A gate surrounds the stacked nanosheet channels and regulates electron/hole flow through the nanosheet channels between the source and drain regions. GAA nanosheet FETs are fabricated by forming alternating layers of channel nanosheets and sacrificial nanosheets. The sacrificial nanosheets are released from the channel nanosheets before the FET device is finalized.

For n-type FETs, the channel nanosheets are typically silicon (Si) and the sacrificial nanosheets are typically silicon germanium (SiGe). For p-type FETs, the channel nanosheets are typically SiGe and the sacrificial nanosheets are typically Si. In some implementations, the channel nanosheet of a p-FET can be SiGe or Si, and the sacrificial nanosheets can be Si or SiGe. Forming the GAA nanosheets from alternating layers of channel nanosheets formed from a first type of semiconductor material (e.g., Si for n-type FETs, and SiGe for p-type FETs) and sacrificial nanosheets formed from a second type of semiconductor material (e.g., SiGe for n-type FETs, and Si for p-type FETs) provides superior channel electrostatics control, which is necessary for continuously scaling gate lengths down to seven (7) nanometer technology and below. The use of multiple layered SiGe/Si sacrificial/channel nanosheets (or Si/SiGe sacrificial/channel nanosheets) to form the channel regions in GAA FET semiconductor devices provides desirable device characteristics, including the introduction of strain at the interface between SiGe and Si.

High mobility channels (e.g., channels including germanium or III-V material) in nanosheet FETs are desired to boost device performance. In general, III-V compound semiconductors are obtained by combining group III elements (e.g., Al, Ga, In) with group V elements (e.g., N, P, As, Sb). However, forming a high mobility channel on a silicon substrate in nanosheet channel regions is challenging because of large lattice-mismatch between the high mobility channel materials and the silicon substrate, which prevents the growth of high quality high mobility channel materials directly on the silicon substrate.

Turning now to an overview of the aspects of the invention, one or more embodiments of the invention address the above-described shortcomings of the prior art by providing methods and nanosheet FET devices with high mobility channels. According to one or more embodiments, aspect ratio trapping (ART) is used to form nanosheet channels with high quality materials (e.g., III-V materials) with large lattice mismatches on a silicon substrate.

The above-described aspects of the invention address the shortcomings of the prior art by providing nanosheet FETs with high mobility channels on a silicon substrate, which boosts the device performance, for example, higher drive current at the same off-state leakage current.

Turning now to a more detailed description of aspects of the present invention, FIGS. 1-14 depict a process flow for fabricating a semiconductor device according to embodiments of the invention. FIG. 1 depicts a cross-sectional side view of a nanosheet stack 111 arranged on a substrate 102. Any number of nanosheet stacks 111 can be arranged on the substrate 102.

The nanosheet stack 111 includes alternating layers of a first nanosheet 106 and a second nanosheet 110. The first nanosheet 106 contacts a blanket dielectric layer 104 arranged on the substrate 102. The first nanosheet 106 includes a first dielectric material, and the second nanosheet 110 includes a second dielectric material that is different than the first dielectric material. Non-limiting examples of materials for the first nanosheet 106 and second nanosheet 110 include silicon dioxide, SiBN, SiCN, SiBCN, SiOCN, SiON, SiOC, or any combination thereof. According to one or more embodiments, the first nanosheet 106 includes silicon dioxide, and the second nanosheet 110 includes SiOC.

Although nanosheet stack 111 includes five layers of first nanosheet 106 and four layers of second nanosheet 110 in the embodiments of the invention shown in FIG. 1A, the nanosheet stack 111 can include any number of first nanosheets 106 and second nanosheets 110. The nanosheet stack 111 can include one or more layers of each of first nanosheet 106 and second nanosheet 110.

The substrate 102 includes one or more semiconductor materials. According to one or more embodiments, the substrate 102 includes silicon. Other non-limiting examples of suitable substrate 102 materials include SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof.

The blanket dielectric layer 104 is arranged between the nanosheet stack 111 and the substrate 102. The dielectric layer 104 includes silicon nitride according to one or more embodiments. The thickness of the blanket dielectric layer 104 is in a range from about 10 nm to about 100 nm according to one or more embodiments.

After forming the dielectric layer 104 on the substrate 102, the first nanosheet 106 and second nanosheet 110 material are deposited onto the dielectric layer 104. The first nanosheet 106 and second nanosheet 110 materials are patterned and etched into nanosheet stack 111.

Figure 2A:
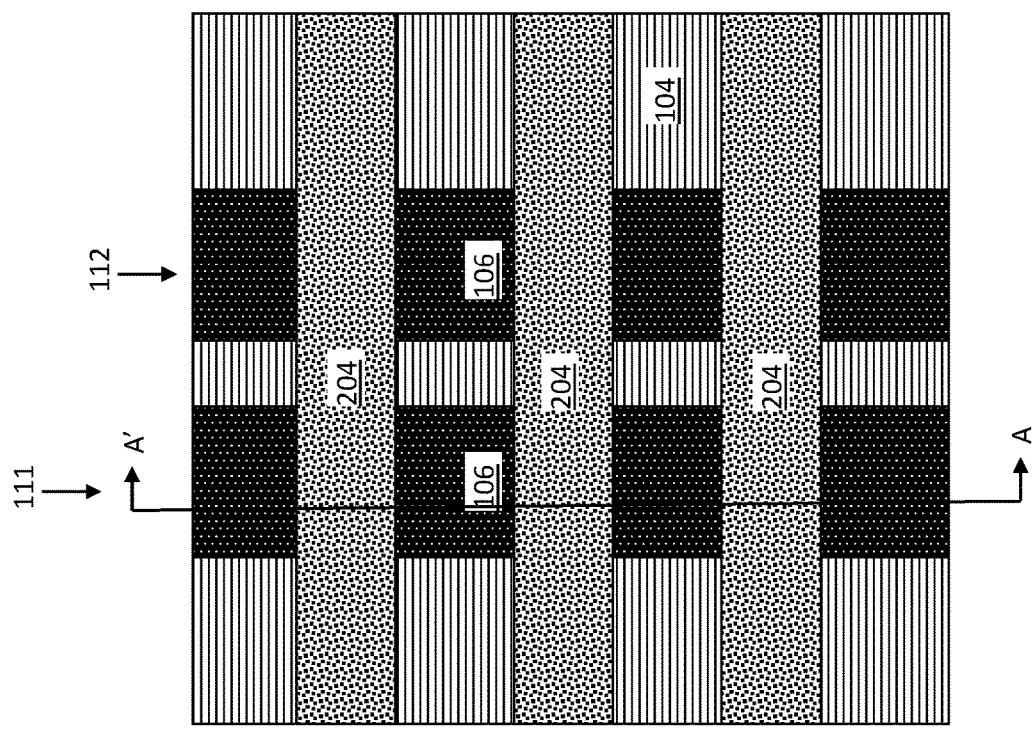
FIG. 2A depicts a top view of the semiconductor structure shown in FIG. 2B, wherein the semiconductor structure has been rotated by 90 degrees counterclockwise, after forming dummy gates on the nanosheet stack.
Figure 2B:
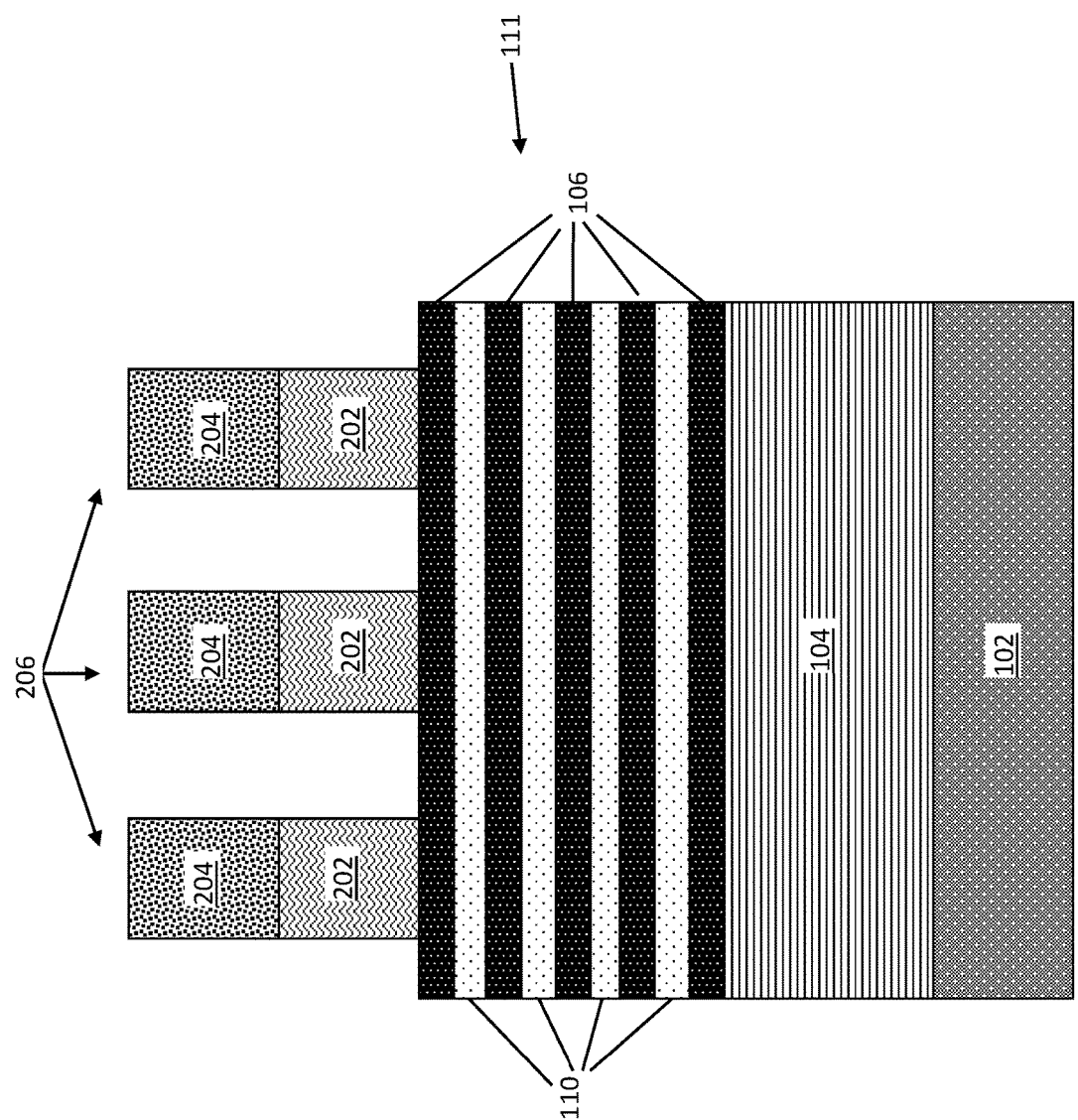
FIG. 2B depicts a cross-sectional side view of the semiconductor structure shown in FIG. 2A taken along line A-A'.

FIG. 2B depicts a cross-sectional side view through the A-A axis of FIG. 2A after forming one or more dummy gates 206 on nanosheet stack 111, 112. Although two nanosheet stacks 111, 112 are shown in FIG. 2B, any number of nanosheet stacks 111, 112 can be formed. The dummy gates 206 each include a dummy gate material 202 (sacrificial gate material) and a hard mask layer 204. The dummy gate material 202 is deposited on the nanosheet stacks 111, 112 by a deposition process and can include, for example, amorphous silicon (aSi), polycrystalline silicon (polysilicon), amorphous carbon, or a combination thereof. An insulating hard mask layer 204 for example, silicon nitride (SiN), SiOCN, or SiBCN, is deposited on the dummy gate material 202 to form the gate cap. The dummy gate material 202 and the hard mask layer 204 are patterned and etched to form the dummy gates 206. For example, photolithography, sidewall imaging transfer can be used to pattern the dummy gates.

Figure 3:
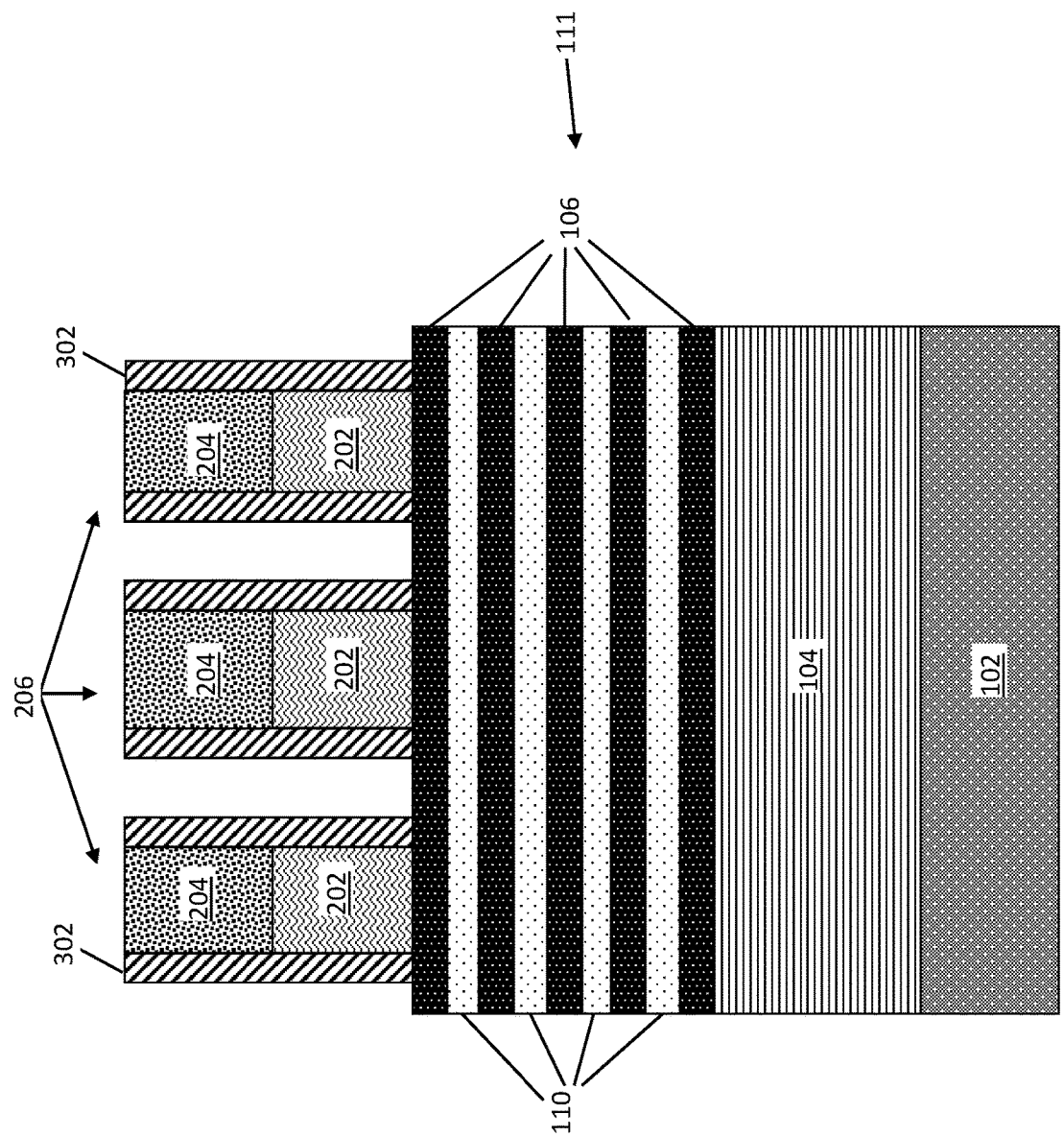

The below described FIGS. 3-14 of the process flow show cross-sectional views through the A-A' axis of FIG. 2A. FIG. 3 depicts a cross-sectional side view after forming gate spacers 302 on the dummy gates 206. To form the gate spacers, 302, a dielectric material, for example, silicon dioxide, silicon nitride, SiOCN, or SiBCN, is deposited on the dummy gates 206. Other non-limiting examples of materials for the gates spacers 302 include oxides, nitrides, oxynitrides, or any combination thereof. An anisotropic etch process, for example, reactive ion etch (RIE), is performed to etch the spacer material to form gate spacers 302 along lateral sidewalls of the dummy gate material 202 and hard mask layer 204.

Figure 4:
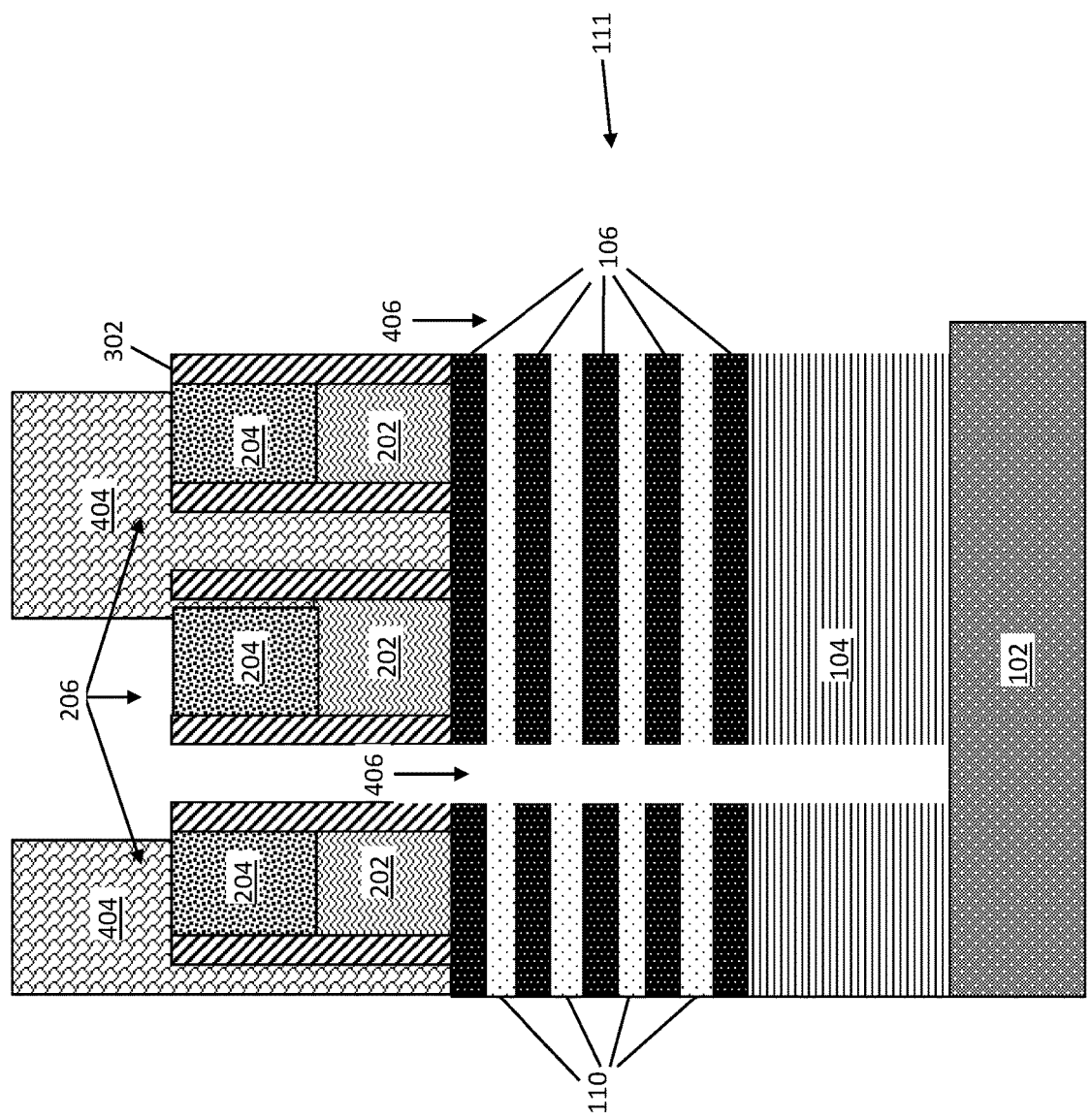

FIG. 4 depicts a cross-sectional side view after depositing and patterning a mask 404 and etching to form trenches 406 (first trenches) adjacent to the dummy gates 206 in source/drain regions. Trenches 406 are formed in alternating source/drain regions. The trenches 406 will be used in an aspect ratio trapping (ART) process. The mask 404 is deposited onto the dummy gates 206. The mask 404 can be a resist material, such as a photoresist, that is patterned to form openings in the mask 404 over alternating source/drain regions. The patterned mask 404 is used to form trenches 406 by removing the dielectric material, including first and second nanosheets 106, 110 from the nanosheet stack 111 and the dielectric layer 104 beneath the nanosheet stack 111. One or more etch processes can be used, for example, including RIE.

Figure 5:
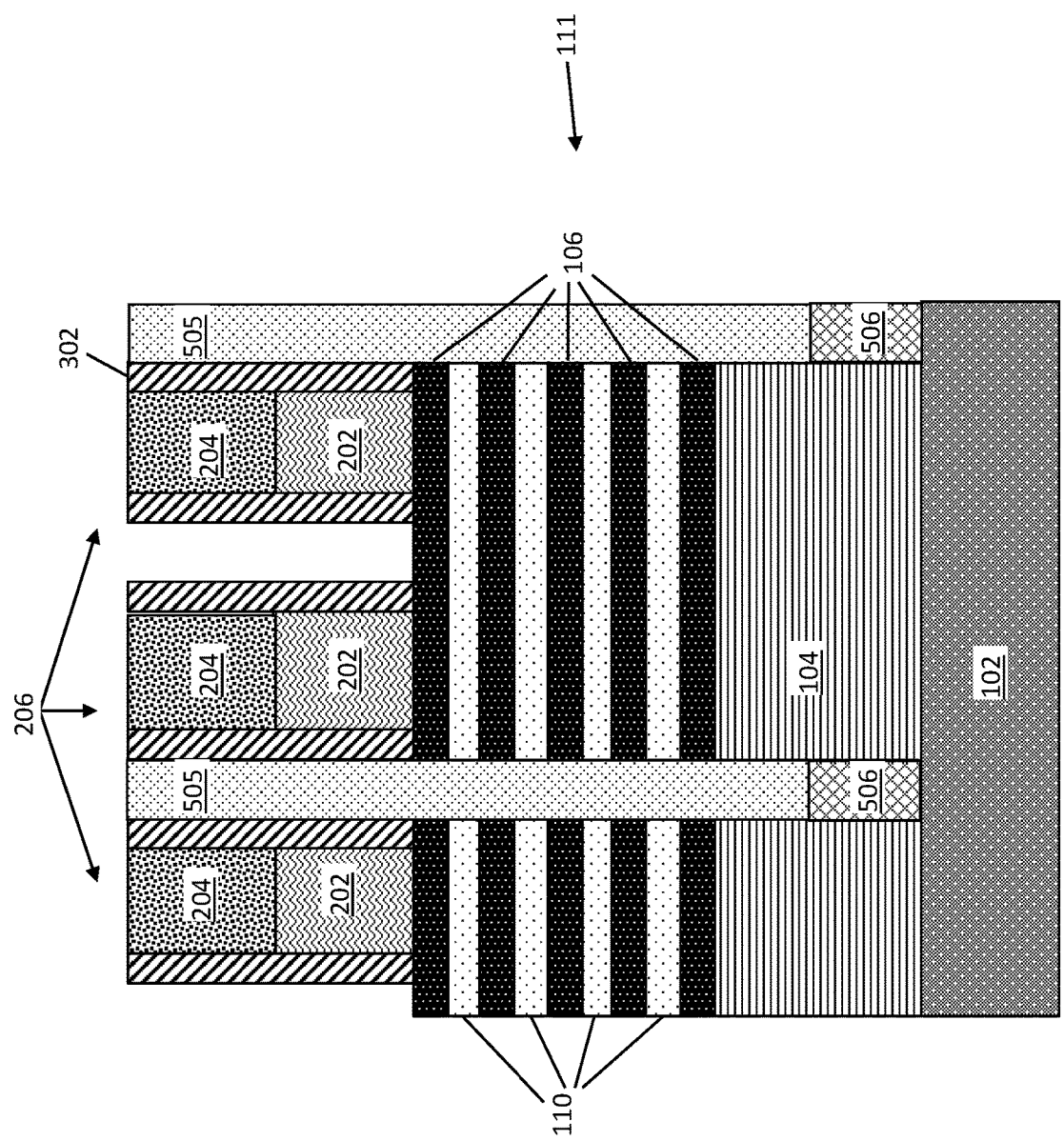

FIG. 5 depicts a cross-sectional side view after performing an epitaxial growth process to form epitaxial growth 505 (first semiconductor material) in the trenches 406. The mask 404 is removed before the epitaxial growth. An aspect ratio trapping (ART) process is performed to form an epitaxial growth 505 including a semiconductor material that is different than (in term of composition and lattice constant) the semiconductor material of the substrate 102. ART processes enable growth of tall and narrow high quality materials (e.g., silicon germanium, germanium, or III-V materials) with large lattice mismatch with the silicon substrate. Growing tall, narrow high quality SiGe, Ge, or III-V materials directly on a silicon substrate is challenging because too many defects generally result that can compromise the structure. However, ART processes constrain the growth area (e.g., by growing the material within the confines of a trench), which can trap the defects in the lattice-mismatched (with respect to the substrate) growth material at the lower portion of the trench and allow the growth of high quality lattice-mismatched (with respect to the substrate) growth material at the upper portion of the trench.

The epitaxial growth 505 is grown all the way to the top of the trenches 406 and over the dummy gates 206. A planarization process, for example, chemical mechanical planarization (CMP), is performed to remove excess growth that extends over the dummy gates 206. Because the semiconductor material of the epitaxial growth 505 is different than the substrate 102, an area of dislocation 506 occurs in an area in contact with the substrate 102. The area of dislocation 506 results from the lattice mismatch between the substrate 102 and the epitaxial growth 505.

Non-limiting examples of materials for the epitaxial growth 505 include for example, silicon germanium, germanium, or III-V materials, such as indium phosphide (InP), gallium arsenide (GaAs), aluminum arsenide (AlAs), or any combination thereof. The III-V materials include at least one "III element," such as aluminum (Al), boron (B), gallium (Ga), indium (In), and at least one "V element," such as nitrogen (N), phosphorous (P), arsenic (As), antimony (Sb). According to one or more embodiments, the substrate 102 includes silicon, and the epitaxial growth 505 includes silicon germanium, germanium or a III-V material.

Figure 6:
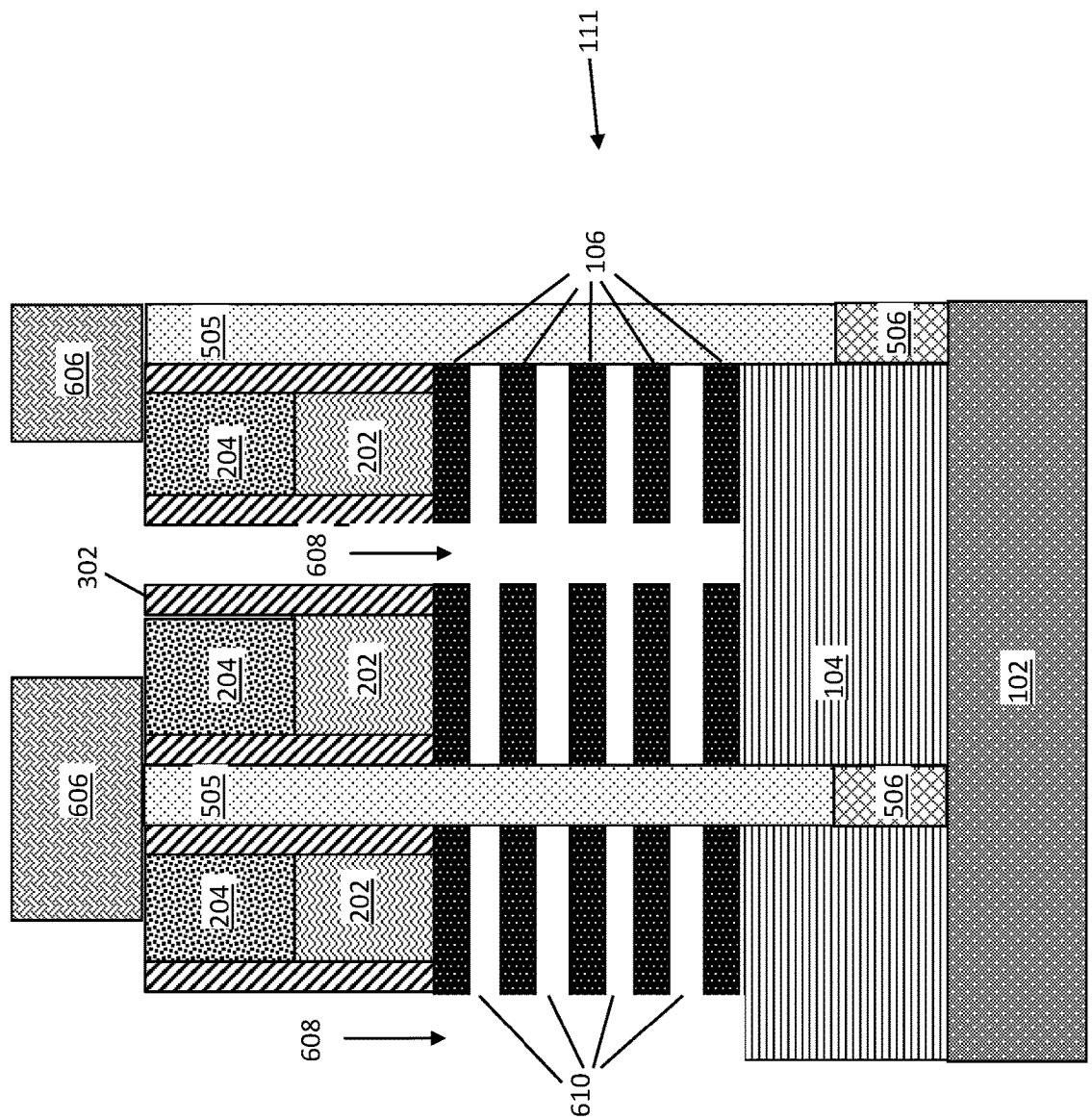

FIG. 6 depicts a cross-sectional side view after patterning a mask 606 and selective etching. The mask 606 is deposited onto the dummy gates 206. The mask 606 can be a resist material, such as a photoresist, that is patterned to form openings in the mask 606. The patterned mask 606 is used to form trenches 608 (second trenches) by removing the dielectric material, including first and second nanosheets 106, 110 from the nanosheet stack 111, stopping on the dielectric layer 104. The trenches 608 are formed over alternating source/drain regions, or over areas that do not include the epitaxial growth 505. The epitaxial growth 505 over the source/drain regions is protected by the mask 606. Then an etch process is performed to selectively remove the second nanosheets 110 from between the first nanosheets 106, leaving open spaces 610 between the first nanosheets 106 that remain anchored in the dummy gates 206, the spacers 302, and the epitaxial growth 505 over the source/drain regions. One or more etch processes can be used, for example, a wet etch or an isotropic dry etch.

Figure 7:
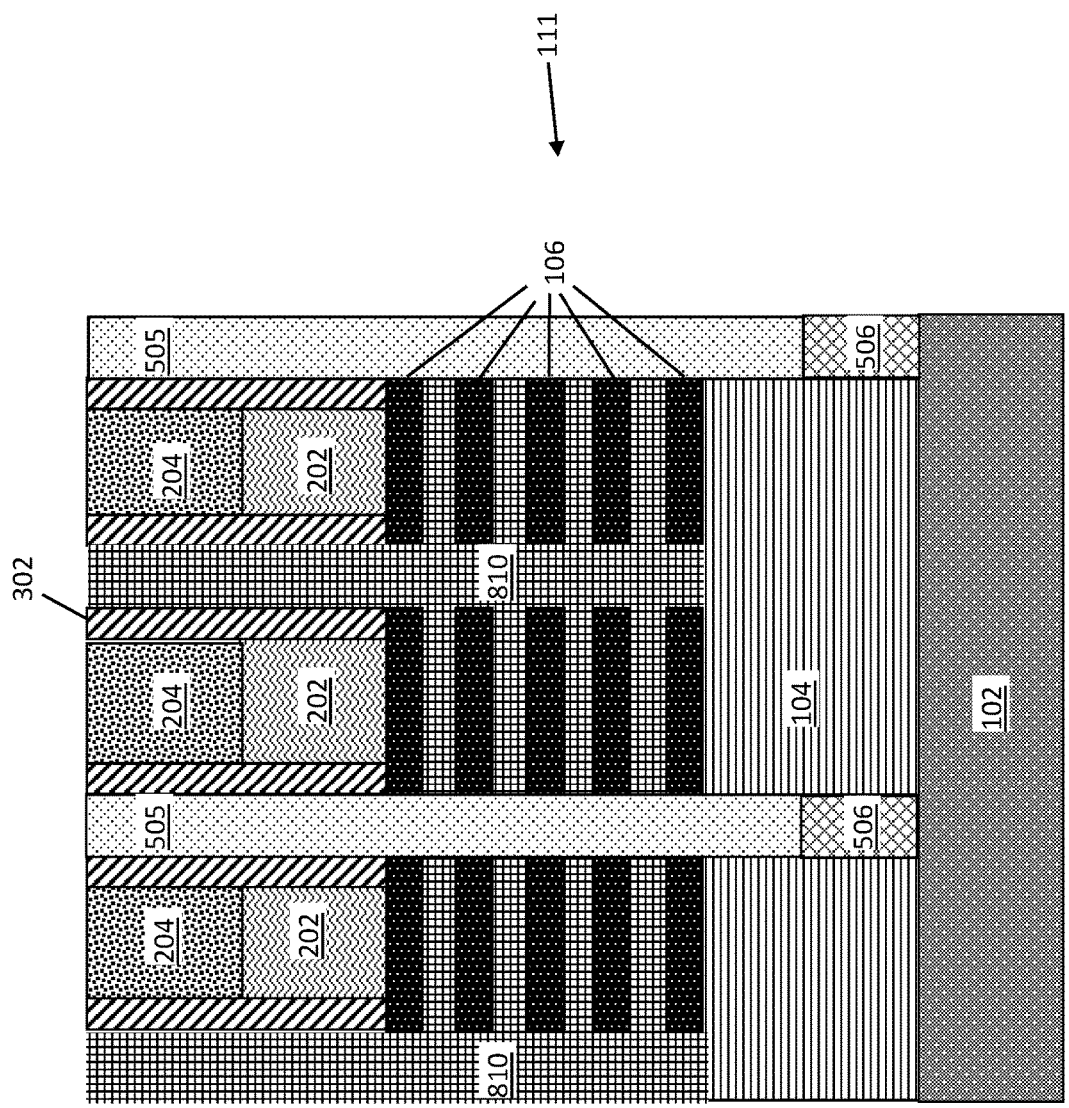

FIG. 7 depicts a cross-sectional side view after removing the mask 606 and performing an epitaxial growth process to form channel materials. The process forms epitaxial growth 810 (second semiconductor material) in the trenches 608 and within the spaces 610 (or channel region gaps) between the first nanosheets 106. The epitaxial growth 810 between the first nanosheets 106 forms the channel regions.

The epitaxial growth 810 forming the channel regions and the epitaxial growth 505 over the source/drain regions include semiconductor materials with a lattice constant match. Non-limiting examples of materials that can be used for the epitaxial growth 810 include silicon germanium, germanium, or III-V materials, such as indium phosphide (InP), gallium arsenide (GaAs), aluminum arsenide (AlAs), or any combination thereof. The III-V materials include at least one "III element," such as aluminum (Al), boron (B), gallium (Ga), indium (In), and at least one "V element," such as nitrogen (N), phosphorous (P), arsenic (As), antimony (Sb).

According to one or more embodiments, the epitaxial growth 505 and the epitaxial growth 810 each includes at least one of germanium and GaAs, which have a lattice match. According to other embodiments, the epitaxial growth 505 and the epitaxial growth 810 each includes at least one of InGaAs and InP, which have a lattice match. After forming the epitaxial growth 810, a planarization process, for example CMP, is performed to remove excess material from the surface of the hard mask layers 204.

Figure 8:
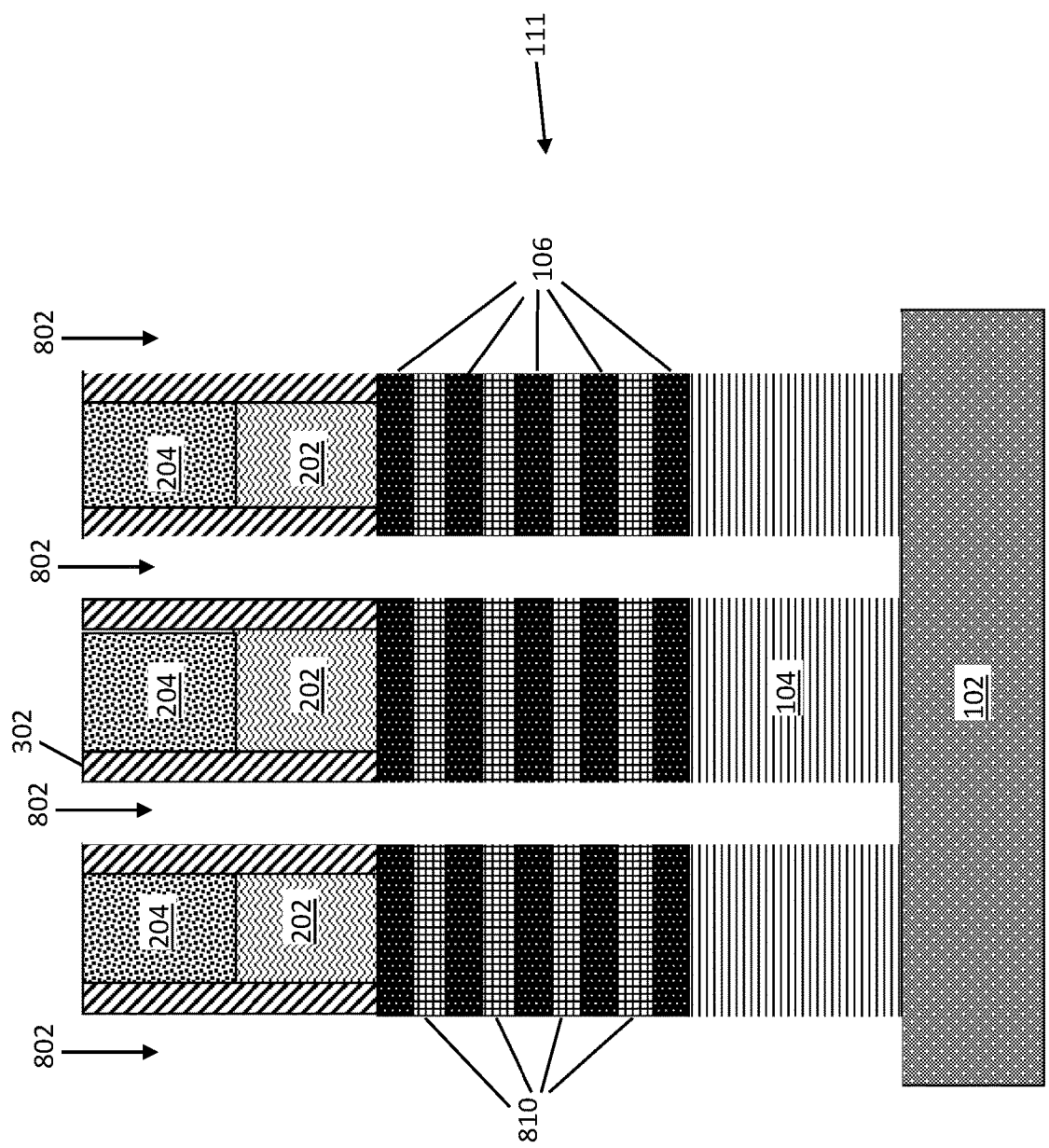

FIG. 8 depicts a cross-sectional side view after etching to remove epitaxial growth 505, epitaxial growth 810, and dielectric layer 104 from the trenches over the source/drain regions. Trenches 802 (third trenches) are formed, which extend to the substrate 102. The etch process includes, for example, a directional RIE process according to one or more embodiments.

Figure 9:
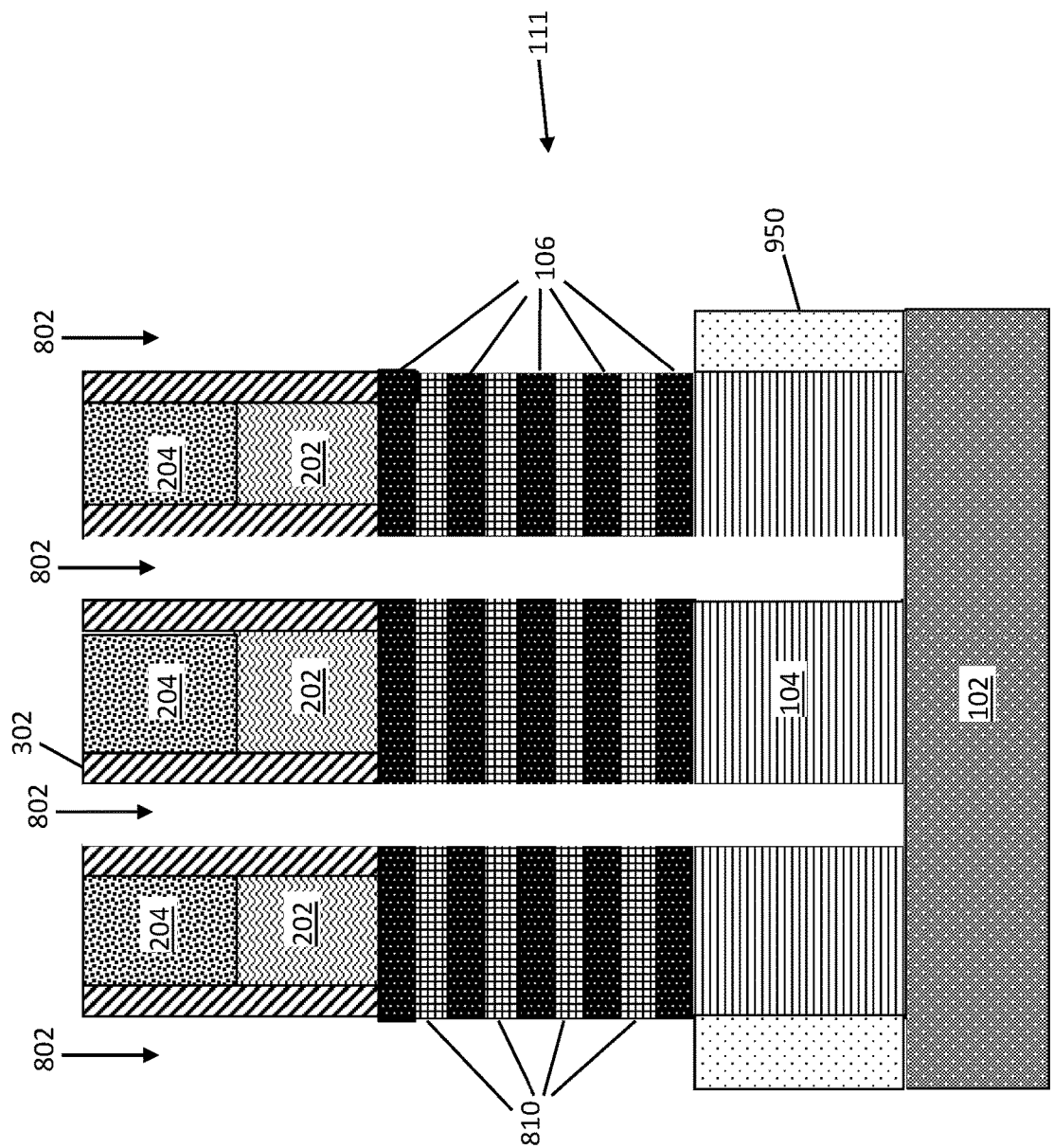

FIG. 9 depicts a cross-sectional side view after depositing a dielectric material 950 on the substrate 102 in trenches 802 and then partially recessing the dielectric material 950 to form isolation regions (e.g., shallow trench isolation (STI) regions). The dielectric material 950 is recessed to a level below the nanosheet stack 111 and channel regions (epitaxial growth 810). Non-limiting examples of materials for the isolation regions include tetraethylorthosilicate (TEOS) oxide, high aspect ratio plasma (HARP) oxide, silicon oxide, high temperature oxide (HTO), high density plasma (HDP) oxide, oxides formed by an atomic layer deposition (ALD) process, silicon oxynitride, or any combination thereof.

Figure 10:
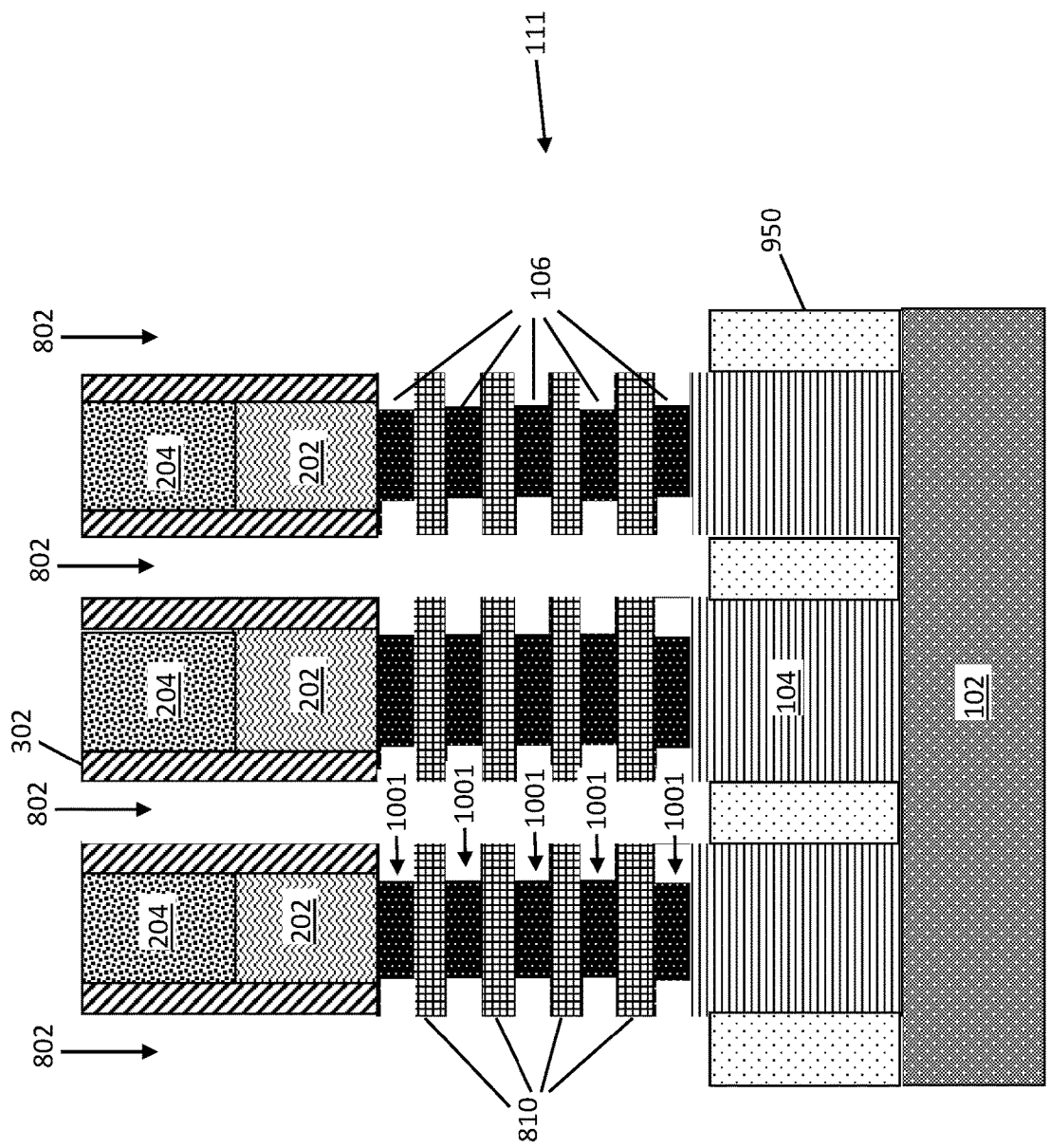

FIG. 10 depicts a cross-sectional side view after performing an etch process to form recesses 1001 for inner spacer formation. An etch process that selectively removes dielectric material from horizontal ends (first end and second end) of the first nanosheet 106 is performed to form recesses 1001.

Figure 11:
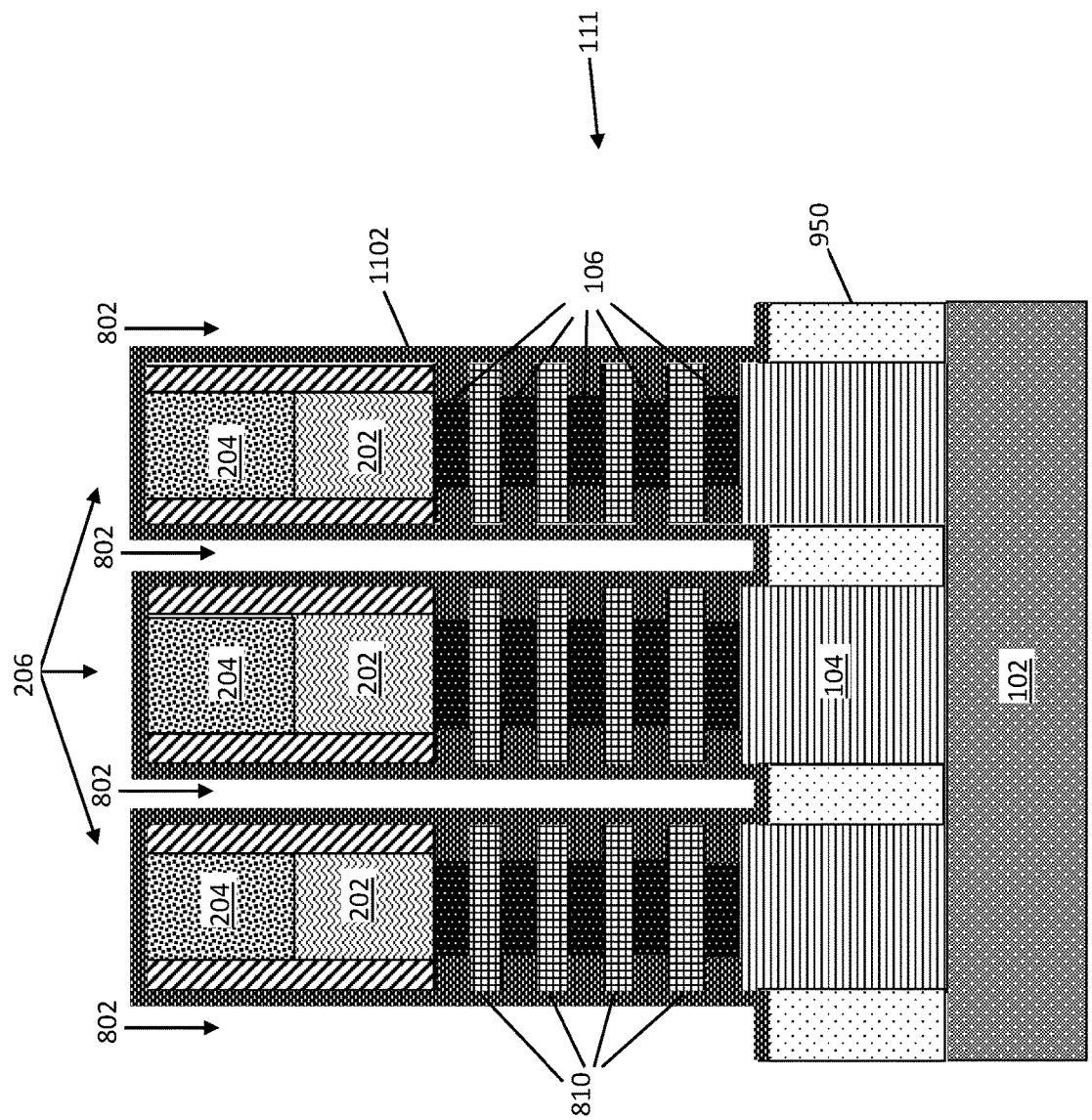

FIG. 11 depicts a cross-sectional side view after depositing inner spacer material 1102 in the recesses 1001. The inner spacer material 1102 is deposited by an isotropic deposition process, such as an ALD process, to form a blanket of material on the dummy gates 206. As the inner spacer material 1102 is deposited onto the vertical sidewalls, the inner spacer material 1102 fills the spaces of the recesses 1001 within the first nanosheets 106. Non-limiting examples of materials for the inner spacer material 1102 include SiBN, SiCN, SiBCN, SiOCN, SiON, SiOC, SiN or any combination thereof.

Figure 12:
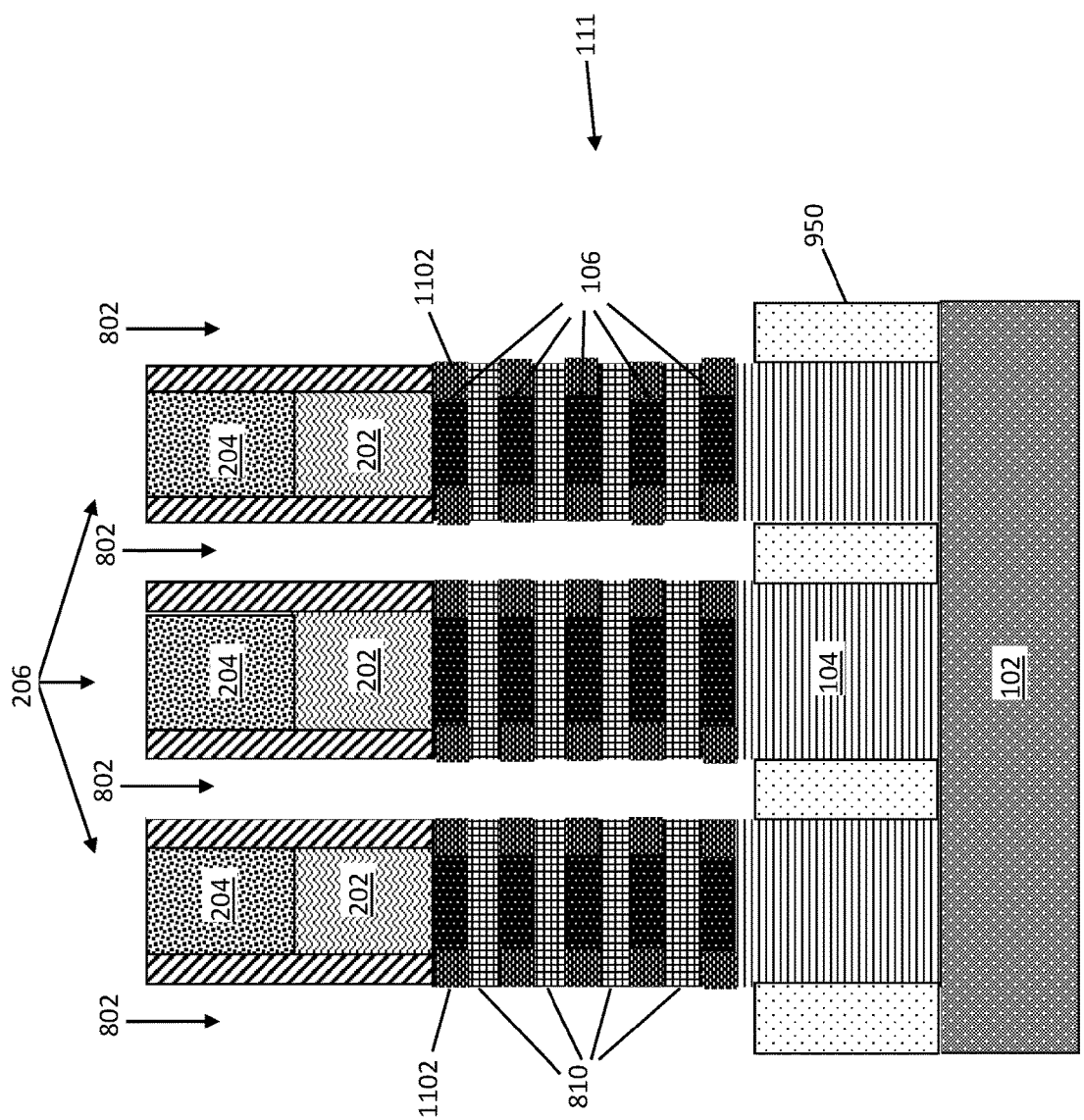

FIG. 12 depicts a cross-sectional side view after removing the inner spacer material 1102 from the vertical sidewalls of the dummy gates 206 and the epitaxial growth 810 forming the channel regions. The resulting inner spacers formed on the horizontal ends of the first nanosheets 106 between the channel regions create barriers between the source/drain regions. An isotropic etch process can be used to form the inner spacers.

Figure 13:
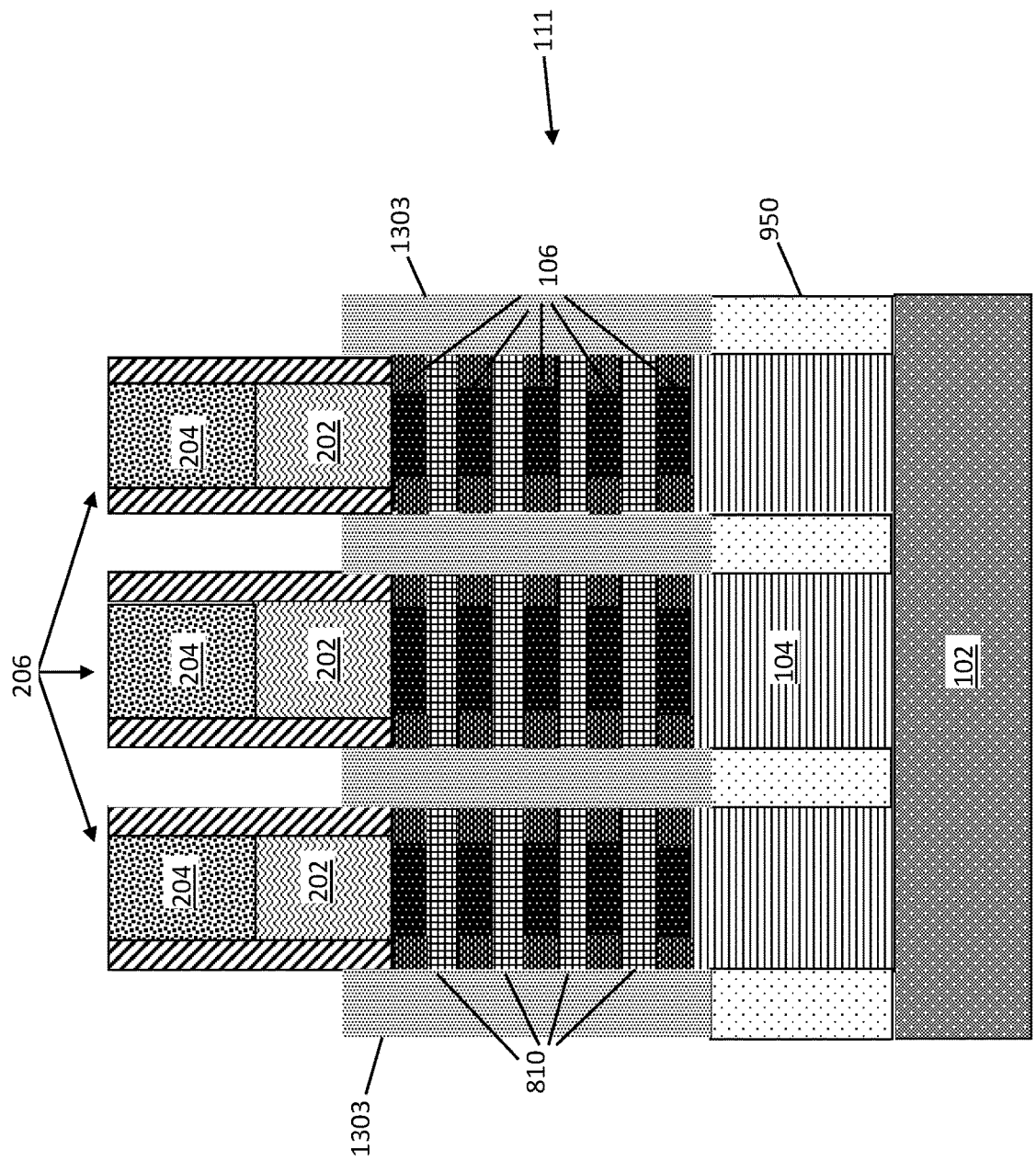

FIG. 13 depicts a cross-sectional side view after performing an epitaxial growth process for form source/drains 1303. The epitaxial material forming the source/drains 1303 is grown on the epitaxial growth 810 in the channel regions beneath the dummy gates 206. The material forming the source/drains 1303 can be different than the material forming the channel regions (epitaxial growth 810). Non-limiting examples of materials that can be used for the epitaxial growth of the source/drains 1303 include silicon germanium, germanium, and III-V materials, such as indium phosphide (InP), gallium arsenide (GaAs), aluminum arsenide (AlAs), or any combination thereof. The III-V materials include at least one "III element," such as aluminum (Al), boron (B), gallium (Ga), indium (In), and at least one "V element," such as nitrogen (N), phosphorous (P), arsenic (As), antimony (Sb).

Figure 14:
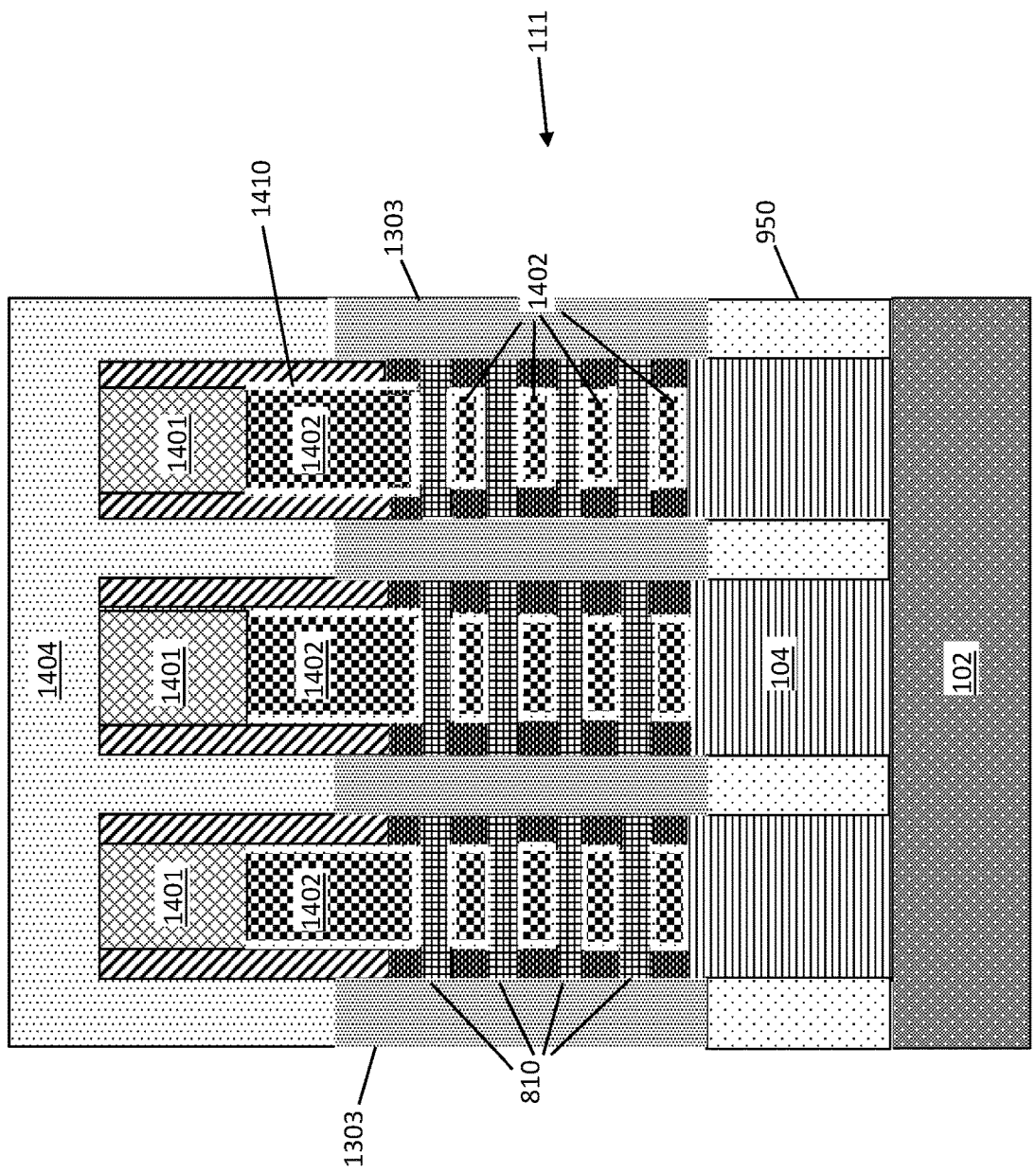

FIG. 14 depicts a cross-sectional side view after replacing dummy gates 206 with metal gate stacks including a gate dielectric layer 1410 and gate metal(s) 1402. The hard mask layer 204 material from the dummy gates 206 is removed, followed by the dummy gate material 202. The dielectric material of the first nanosheets 106 is also selectively removed by one or more selective etch processes, leaving gaps between the epitaxial growth 810 of the channel regions (epitaxial growth 810).

The gate dielectric layer 1410 and gate metal(s) 1402 are then deposited in the gate regions, which fills the spaces previously occupied by the dummy gate material 202, 204 and the first nanosheets 106 (see FIG. 13). The gate dielectric layer 1410 and gate metal(s) 1402 now surround the nanosheet channel regions. The gate dielectric layer 1410 and gate metal(s) 1402 are then recessed below the top of spacers 302 followed by the deposition and formation of dielectric gate caps 1401.

The gate dielectric layer 1410 can be a dielectric material having a dielectric constant greater than about 3.9, about 7.0, or about 10.0. Non-limiting examples of suitable materials for the dielectric material include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate.

The gate metal(s) 1402 can include one or more work function metal(s) and one or more conductive gate metal(s). The work function metal(s) can be disposed over the gate dielectric material. The type of work function metal(s) depends on the type of transistor. Non-limiting examples of suitable work function metals include p-type work function metal materials and n-type work function metal materials. P-type work function materials include compositions such as titanium nitride (TiN), tantalum nitride (TaN), ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. A conductive metal is deposited over the dielectric material(s) and workfunction layer(s) to form the gate stacks. Non-limiting examples of suitable conductive metals include aluminum (Al), platinum (Pt), gold (Au), tungsten (W), titanium (Ti), or any combination thereof.

An interlayer dielectric (ILD) layer 1404 is then deposited on the metal gate stacks. The ILD layer 1404 can be formed from, for example, a low-k dielectric material (with k<4.0), including but not limited to, silicon oxide, spin-on-glass, a flowable oxide, a high density plasma oxide, borophosphosilicate glass (BPSG), or any combination thereof.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating a semiconductor device, the method comprising:
    forming a gate on a nanosheet stack consisting essentially of alternating single layers of a first nanosheet and a second nanosheet, the first nanosheet and the second nanosheet each comprising a dielectric material;
    removing a portion of the nanosheet stack in a source/drain region adjacent to the gate to form a trench;
    depositing a first semiconductor material in the trench;
    removing the second nanosheet from the nanosheet stack to form a channel region gap in the nanosheet stack; and
    depositing a second semiconductor material in the channel region gap to form a channel.

2. The method of claim 1, wherein depositing the first semiconductor material in the trench comprises an aspect ratio trapping process.

3. The method of claim 2, wherein the first semiconductor material comprises silicon germanium, germanium or a III-V material.

4. The method of claim 1 further comprising, subsequent to depositing the first semiconductor material in the trench, removing a portion of the nanosheet stack in another source/drain region adjacent to the gate to form a second trench, and then depositing the second semiconductor material in the second trench.

5. The method of claim 1, wherein depositing the second semiconductor material in the channel region gap comprises an epitaxial growth process.

6. The method of claim 5, wherein the second semiconductor material comprises silicon germanium, germanium or a III-V material.

7. The method of claim 1 further comprising removing the first and second semiconductor materials from the trench and depositing a third semiconductor material to form a source/drain, and the third semiconductor material comprises a semiconductor material that is different than the channel.

8. A method of fabricating a semiconductor device, the method comprising:
    forming a gate on a nanosheet stack consisting essentially of alternating single layers of a first nanosheet and a second nanosheet, the first nanosheet and the second nanosheet each comprising a dielectric material, and the nanosheet stack arranged on a nitride layer;
    removing a portion of the nanosheet stack in a source/drain region adjacent to the gate to form a trench;
    depositing a first semiconductor material in the trench;
    removing the second nanosheet from the nanosheet stack to form a channel region gap in the nanosheet stack; and
    depositing a second semiconductor material in the channel region gap to form a channel, the second semiconductor material comprising silicon germanium, germanium or a III-V material.

9. The method of claim 8, wherein depositing the first semiconductor material in the trench comprises an aspect ratio trapping process.

10. The method of claim 9, wherein the first semiconductor material comprises silicon germanium, germanium or a III-V material.

11. The method of claim 8 further comprising, after depositing the first semiconductor material in the trench, removing a portion of the nanosheet stack in another source/drain region adjacent to the gate to form a second trench, and then depositing the second semiconductor material in the second trench.

12. The method of claim 8, wherein depositing the second semiconductor material in the channel region gap comprises an epitaxial growth process.

13. The method of claim 12, wherein the second semiconductor material comprises silicon germanium, germanium or a III-V material.

14. The method of claim 8 further comprising removing the first and second semiconductor materials from the trench and depositing a third semiconductor material to form a source/drain, and the third semiconductor material comprises a semiconductor material that is different than the channel.

15. A semiconductor device comprising:
    a nanosheet channel comprising silicon germanium, germanium or a III-V material arranged on a substrate;
    a nitride layer is arranged in the substrate, the nanosheet channel arranged on the nitride layer;
    a gate arranged on the nanosheet channel; and
    a source/drain adjacent to the channel.

16. The semiconductor device of claim 15, wherein the substrate comprises silicon.

17. The semiconductor device of claim 15, wherein the source/drain comprises silicon germanium, germanium or a III-V material.

18. The semiconductor device of claim 15, wherein the source/drain comprises a material that is different than the nanosheet channel.

19. The semiconductor device of claim 15, wherein the nanosheet channel comprises and epitaxial growth.

20. The method of claim 8, wherein the nitride layer comprises silicon nitride.

* * * * *